(12) United States Patent
Hobboosh et al.

(10) Patent No.: US 6,809,586 B1
(45) Date of Patent: Oct. 26, 2004

(54) DIGITAL SWITCHING POWER AMPLIFIER

(75) Inventors: Namir W. Hobboosh, Dartmouth, MA (US); Martin L. Cohen, Newport, RI (US)

(73) Assignee: Raytheon Company, Waltham, MA (US)

( * ) Notice: Subject to any disclaimer, the term of this patent is extended or adjusted under 35 U.S.C. 154(b) by 9 days.

(21) Appl. No.: 10/436,943

(22) Filed: May 13, 2003

(51) Int. Cl.[7] .............................................. H03F 3/38
(52) U.S. Cl. ...................... 330/10; 330/146; 330/207 A
(58) Field of Search ...................... 330/10, 251, 207 A, 330/146, 72; 375/238

(56) References Cited

U.S. PATENT DOCUMENTS

| | | | |
|---|---|---|---|
| 2,235,677 A | | 3/1941 | Gubin |
| 3,157,839 A | | 11/1964 | Brown et al. |
| 4,092,610 A | * | 5/1978 | White et al. ............. 330/207 A |
| 6,211,735 B1 | * | 4/2001 | Luu ............................ 330/251 |
| 6,636,113 B1 | * | 10/2003 | Kirn ............................ 330/10 |

* cited by examiner

*Primary Examiner*—Henry Choe
(74) *Attorney, Agent, or Firm*—Daly, Crowley & Mofford, LLP

(57) ABSTRACT

Apparatus for transmitting a collimated and directed beam of wave energy which includes a beam-forming network having a plurality of amplification sections coupled to an array of transmitting elements. Each one of the sections includes: a source of digital samples of the wave energy; a digital filter fed by digital samples for providing a time delay to the replica; and an amplification system. The amplification system includes: a bridge amplifier producing a feedback signal representative of current passing through a bridge circuit; an analog to digital converter section to produce a corresponding digital feedback signal; a digital summer fed by digital samples of a signal to be amplified and by the digital feedback signal for producing a composite digital signal; and a modulator section fed by the composite digital signal and the carrier signal source produced signal for producing the plurality of switching signals for the amplifying elements.

7 Claims, 4 Drawing Sheets

DIGITAL SWITCHING POWER AMPLIFIER

TECHNICAL FIELD

This invention relates to power amplifiers and more particularly to bridge amplifiers.

BACKGROUND

As is known in the art, power amplifiers have a wide range of applications. One such power amplifier is a bridge amplifier. An early bridge amplifier is described in U.S. Pat. No. 2,235,677 Entitled "Amplifier for Signal Transmission" issued Mar. 18, 1941, inventor S. Gubin. The bridge amplifier described in the Gubin patent used thermionc emission devices. With the advent of transistors, the amplifier of Gubin was further improved by including a feedback signal to sense mismatches in the transistors and thereby apply a compensation voltage to the control electrodes of the transistors and thereby maintain apparent identity in operating characteristics of the transistors. Such improvement is described in U.S. Pat. No. 3,157,839, issued Nov. 17, 1064, entitled "Transistor Bridge Amplifier with a Bias Compensation Circuit Therefore", inventor H. B. Brown et al. Further improvement in the bridge amplifier were made by using, inter alia, a pair of feedback signals, one proportional to current passing through the load connected to the output of the amplifier and one proportional to the voltage produced across the load. Such improved bridge amplifier is described in U.S. Pat. No. 4,092,610, issued May 30, 1978 entitled "Modulated Carrier Amplifying System", inventors Benjermin J. White, George Moreau, Robert E. Dworkin, assigned to the same assignee as the present invention.

As described in U.S. Pat. No. 4,092,610, a signal to be amplified, after being combined with the feedback signal, is modulated with a carrier signal and the resulting signal is fed to the bridge amplifier. One such amplifier circuit 10 is shown in FIG. 1. Thus, the input signal is fed to a summing amplifier 12 analog with a pair of feedback signals. One such feedback signal $V_{FB1}$ is a function of the voltage, $V_L$, produced across output terminals 14a, 14b of a bridge amplifier 13 and the other feedback signal $V_{FB2}$ is a function of the current $I_L$, to the output terminals 14a, 14b. The output of the summing amplifier 12 is combined with the modulating signal, here, for example a square wave of sawtooth wave voltage, produced by carrier signal generator 15, in a pair of comparators 16a, 16b, as shown. The comparators 16a, 16b produce a pair of pulse width modulated (PWM) switching signals $PWM_1$ and $PWM_2$, respectively. Inverters 18a, 18b are provided to generate a complementary pair of pulse width modulated signals $PWM_1'$ and $PWM_2'$, respectively. The four PWM signals are fed to the switching bridge amplifier 13, as shown. The switching bridge amplifier 13 includes four amplifier elements, here transistors 22a, 22b, 22c and 22d arranged as shown in a bridge circuit having four nodes $N_1$, $N_2$, $N_3$, and $N_4$. Nodes $N_1$ and $N_2$ arc connected across a voltage source $+V_s$ and nodes $N_3$ and $N_4$ are connected to output terminals 14a, 14b. The output terminals 16a, 16b are connected to load here represented by a resistor $R_L$, in a manner to be described in more detail below. Switching diodes 24a, 24b, 24c and 24d are arranged as shown. The operation and further details of the circuit shown in FIG. 1 are provided in the above referenced U. S. Pat. No. 4,092,610, referred to above, the entire contents thereof being incorporated herein by reference.

As described in U.S. Pat. No. 4,092,610, the bridge amplifier 13 further comprises a transformer 17 having an input winding coupled via a capacitor to a pair of opposite nodes, here nodes $N_2$ and $N_4$ of the bridge circuit. A current sensor 19 is also coupled in series with the input winding for providing a voltage on line 21 having a magnitude proportional to the current in the input winding. The current sensor 19 comprises a transformer having a single turn of wire as its input winding and a multiple turn winding for its output winding with a potentiometer coupled across the terminals of the output winding. The current sensor 19 presents negligible impedance to the circuit of the input winding. The transformer 17 has a winding, which couples the signal of the winding via the lines 23 to a filter 25. The winding provides a voltage between lines 23, which is proportional to the voltage produced by the winding. The voltage on the lines 21 and 23 provide feedback signals which are summed together and with the input signal, in summing amplifier 12, as described above.

As noted above, the output terminals 14a, 14b are coupled, via transformer 17, to the filter 25. The filter 25 comprises, by a way of example, a resonant tank circuit including an inductor and a capacitor, and a capacitive shunt, which includes a resistor and a capacitor. The tank resonates at the repetition frequency of the carrier frequency signal produced by generator 15. The tank circuit thus blocks the passage of signals at the repetition frequency while the shunt shorts out harmonics of the input signal thereby providing a stop band which minimizes the appearance of carrier and harmonic frequency components at the load, here a transducer, or projector. A capacitor in series with the tank blocks direct current from the load. The load is shown as a resistive element, $R_L$, which coats with the filter to provide the foregoing pass band.

In operation, when amplifying units (i.e., transistors 22a, 22d) conduct current simultaneously, the amplifying elements (i.e., transistors 22b, 22c) conduct no current. Conversely, when the amplifying elements (i.e., transistors 22b, 22c) are driven by switching signals to conduct current simultaneously, amplifying elements (i.e., transistors 22a, 22d) conduct no current. Thus, the direction of current in the input winding of the transformer 17 alternates in direction to provide both positive and negative pulses of current to the load, $R_L$. In view of the filtering provided by the filter 25 and any reactance in both the load, $R_L$ and the elements of the bridge amplifier 10, the signal appearing in the load, $R_L$ has an instantaneous amplitude which follows that of the input signal fed to the amplifier system 10. The use of the four transistors in the bridge amplifier 13 permits application of a greater amount of power to the load than could be provided by simply one or two transistors. Further, the sequential operation of the branches of the bridge providing for a lower average value of power dissipation in each one of the four transistors.

One application of the amplifier system 10 shown in FIG. 1 is in a sonar system. Such a system is shown in FIG. 2. Here, a digital waveform generator 30 produces digital samples of acoustic wave energy. The digital samples are fed to a transmit bean forming network 32. The beam forming network has a plurality of output ports, each producing the digital samples representing a burst of acoustic wave energy with a predetermined time delay in accordance with the desired transmit direction of the burst of energy. That is the beam forming network 32 is used to provide a collimated and directed beam of acoustic energy. The digital samples at each one of the output ports is fed to a digital to analog (D/A) converter 34, as shown for conversion onto analog (i.e., time-continuous) bursts of acoustic energy. These bursts of energy are fed to a corresponding one of a plurality of the amplifier systems 10 shown in FIG. 1. The amplified bursts of acoustic energy are fed to selected sets of transducers, or projectors 36 in an array of such projectors 36 through an aperture switching network 38, as shown.

DESCRIPTION OF DRAWINGS

Like reference symbols in the various drawings indicate like elements.

DETAILED DESCRIPTION

Figure 3:
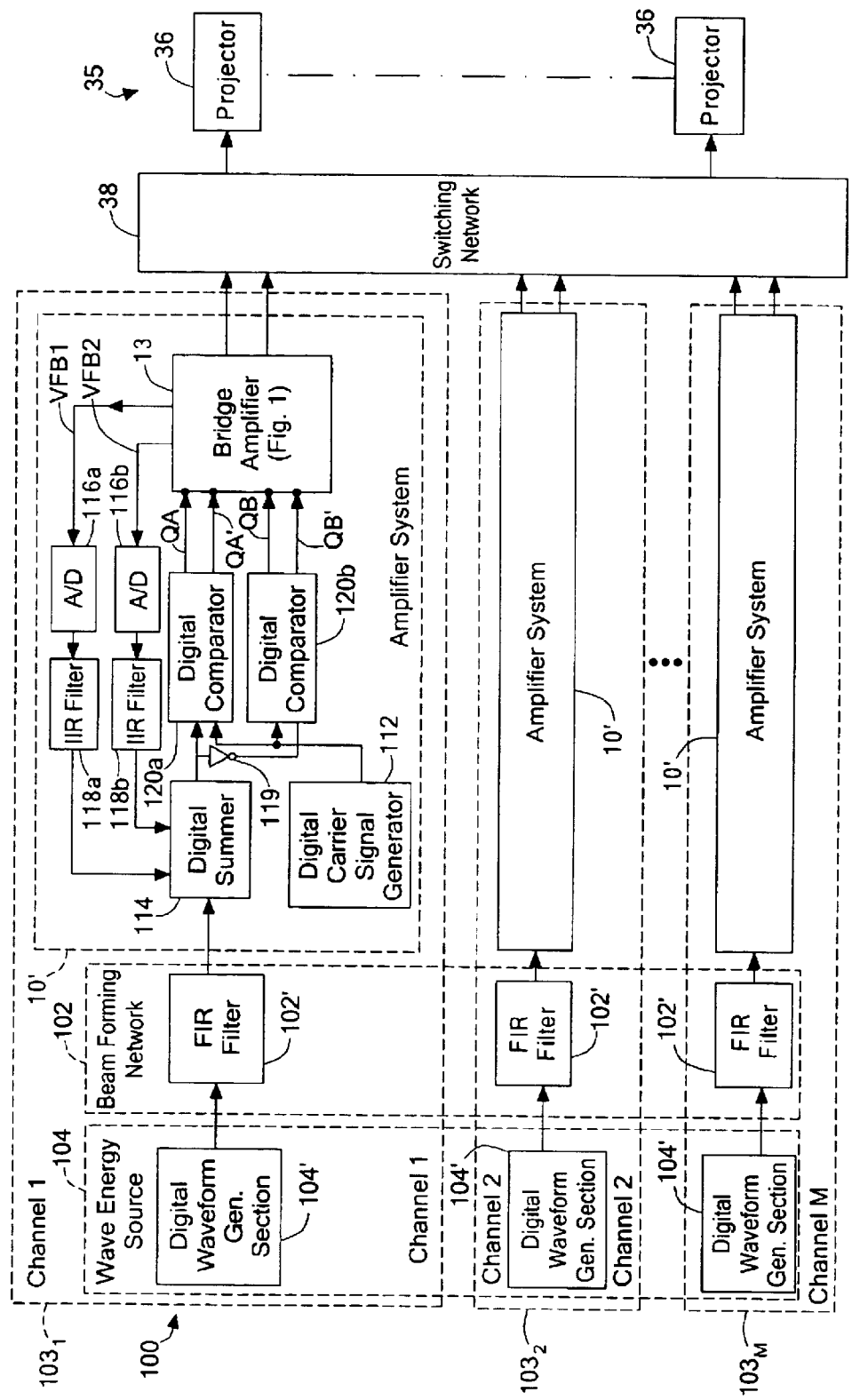
FIG. 3 is a block diagram of a wave energy transmitting system according to the invention.

Referring now to FIG. 3, apparatus 100 is shown for transmitting a collimated and directed beam of wave energy, here, for example, sonar (i.e., acoustic wave energy), it being understood that other wave energy may be collimated and detected such as radar (electromagnetic wave energy). The apparatus 100 includes a beam-forming network 102 fed by a source 104 of the wave energy. The source 104 of the energy may be a digital waveform generator that produces digital samples of the energy, as when the shape of the energy is known, a prioi. Other sources may be used such as a continuous stream of data, as when speech is picked up by a microphone and then passed through an analog to digital conversion to provide a continuous stream of data. Here, in this embodiment, the waveform generator 104 includes a plurality of digital waveform generator sections 104', here Random Access Memories (RAMs) having-stored therein digital samples of a burst, or pulse, of acoustic wave energy. The digital samples of each burst are produced at a rate three to four times the highest bandwidth of the pulse.

The digital samples produced by each one of the digital waveform generator sections 104' are fed to a corresponding one of a plurality of Finite Impulse Response (FIR) filters 102' in the beam forming network 102, as shown. The FIR filters 102' provide interpolation to the digital samples fed thereto to thereby increase the effective digital sampling rate to about ten times the bandwidth of the pulse. As will be discussed below, this interpolation factor is programmable. The interpolated outputs of the FIR filters provide a "fine" delay for beam-forming. A courser delay is provided by indexing (or offsetting) data from the RAM. It is the combination of course and fine delay, coupled with amplitude shading (i.e., the amplifier system, to be described) that generated the collimated beam. These time delays are selected to provide, across the outputs of the beam forming network 104, data which represents a collimated beam of energy having a direction in accordance with digital signals fed the beam forming network 104 by a conventional beam steering computer, not shown. Thus, the beam-forming network 104 couples the digital samples of the wave energy with distribution of time delays across the output ports of network 104, such distribution of time delays being in accordance with direction of the transmitted beam of wave energy.

Each one of the digital outputs of the beam forming network 104 (i.e., the outputs of the FIR filters 104') is fed to a corresponding one of a plurality of amplifier systems 10'. Each one of the amplifier systems 10' includes a digital carrier signal generator 112. The carrier signal generator 112 generates digital samples of a carrier frequency signal, here, for example, a sawtooth waveform. As will be described, the carrier signal waveform generator 112 is programmable. The carrier signal generator 112 may, for example, be a digital memory (e.g. DRAM) for storing samples of the carrier signal, or a digital processor for generating such samples from a priori stored data representing the carrier waveform, (e.g., slope, slope time duration, etc.).

Each one of the amplifier systems 10' includes a digital summer 114. The digital summer 114 is fed by the digital samples produced by the one of the FIR filters 102' coupled thereto. Also fed to the digital summer 114 are digital samples representative of current and voltages produced in a bridge amplifier 13 described in FIG. 1 and included in the amplifier system 10'. More particularly, the voltages $VFB_1$, $VFB_2$ produced by the bridge circuit 13 (FIG. 1) are fed to analog to digital converts 116a, 116b, respectively, as shown. The digital samples produced by converts 116a, 116b are fed to Infinite Impulse Response (IF filters 118a,m 118b, respectively, as shown. It should be noted that these IIR filters are programmable, allowing the system to be tuned to match the bridge and the load characteristics. The filtered digital samples produced by converts 118a, 118b are fed to the digital summer 114, as shown. The digital summer 114 digital combines the three sets of digital samples fed thereto into a composite digital signal. The composite digital signal is fed to a pair of digital comparators 120a, 120b, the samples fed to comparator 120b being first complemented here by inverter 119. Also fed to the comparators 120a, 120b are the digital samples of the modulating signal produced by the carrier signal generator 112, as indicated.

The output of digital comparator 120a is a PWM train of logic signal ($Q_A$) and its complement $Q_A'$. These signals provide the switching signals for the transistors 22a, 22b, respectively, described above in connection with FIG. 1. The output of digital comparator 120b is likewise a PWM train of logic signal ($Q_B$) and its complement $Q_B'$. These signals provide the switching signals for the transistors 22c, 22d, respectively, described above in connection with FIG. 1.

Thus, the beam-forming network 102 may be constructed as a plurality of, here M. amplification sections, or channels $103_1$–$103_M$, as indicated. Each one of the channels $103_1$–$103_M$ includes: (a) a source 104' of the digital samples of the wave energy; (b) a digital filter 102' fed by digital samples for providing a time delay to the replica; and (c) an amplification system 10'. The amplification system 10' includes a bridge amplifier 13. The bridge amplifier 13 includes a plurality of amplifying elements, here transistors 22a–22d, arranged in legs of a bridge circuit, a first pair of nodes of the bridge circuit being coupled across a voltage supply and second pair of nodes of the bridge circuit being coupled to a load. The amplifying elements are fed by a plurality of switching signals, $Q_A$, $Q'_A$, $Q_B$, $Q'_B$. The bridge amplifier 13 produces a feedback signal representative of current passing through the bridge circuit and a voltage produced by the bridge across the second pair of nodes. An analog to digital converter section 116a, 116b is fed by the feedback signal for converting such feedback signal into a corresponding digital feedback signal. A digital summer 114 is fed by digital samples of a signal to be amplified by the amplification system and by the digital feedback signal for producing a composite digital signal. A modulator section 120a, 120b is by the composite digital signal and the carrier signal source 112 produced signal for producing the plurality of switching signals for the bridge amplifier 13 amplifying elements 22a–22d.

An array 35 of transmitting elements, here projectors 36 is included. The array of projectors 36 is coupled to the plurality of amplification sections 10' selectively by an aperture switching section 38.

Figure 4:
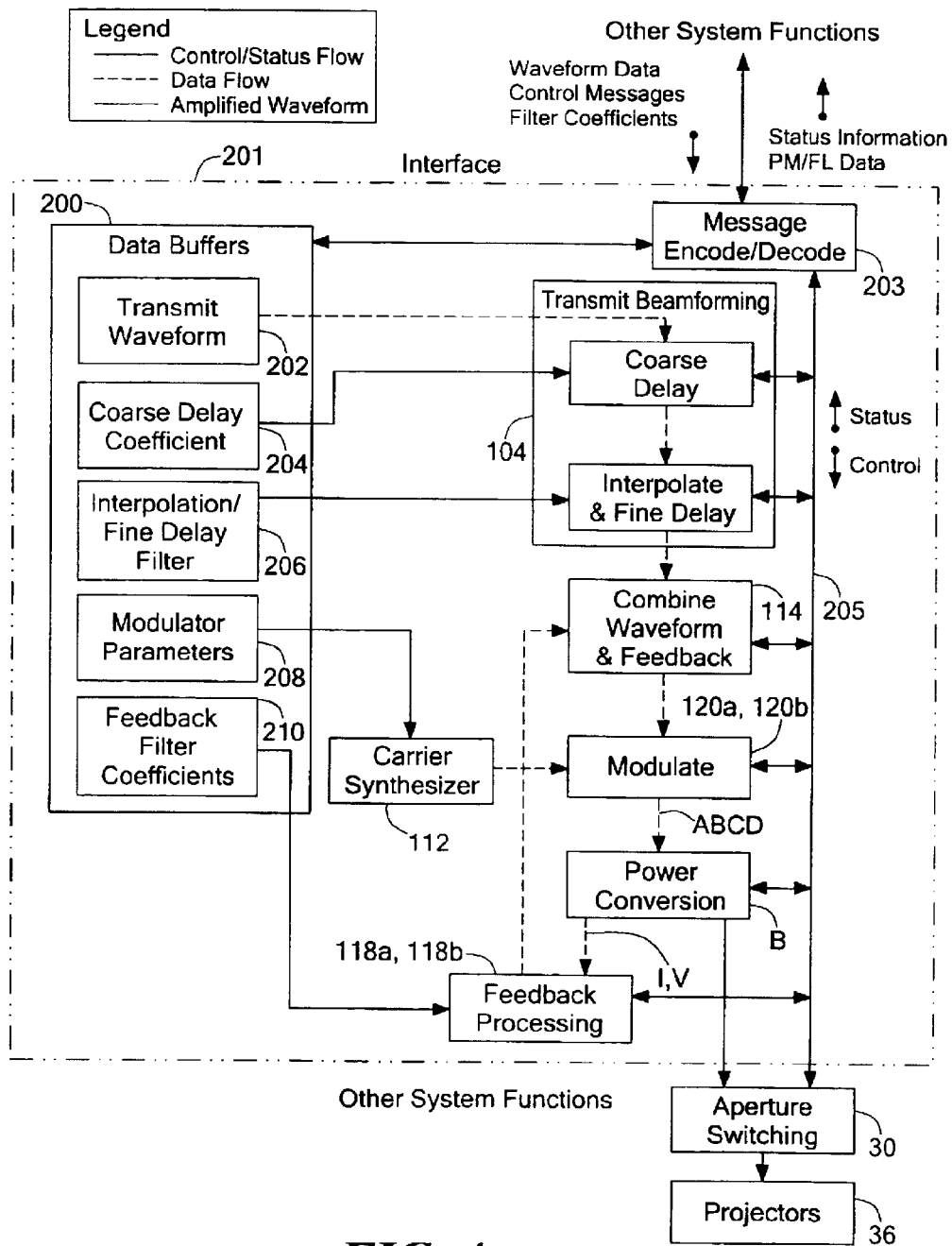
FIG. 4 is a functional block diagram of system of FIG. 3.

Referring now to FIG. 4, a functional block diagram of the transmitter system 100 of FIG. 3 is shown. Here, the system 100 is shown to include an interface 201 between a pair of "other systems", not shown. It is noted that the system interface 201 may be a self contained module for use in a corresponding one of the channels $103_1$–$103_M$. Thus, each such module, or interface 201 includes: an FIR filter 102', and an amplifier system 10', shown in FIG. 3.

One of the pair of "other systems" provides to the interface 201 waveform data, control messages, and IIR and FIR filter coefficients. Such one of the pair of "other systems" receives status information and performance monitoring (PM) and fault localization (FL) information from the interface and from the other system (here the aperture switching network 38 coupled to the interface 201.

The interface 201 includes a message encoder/decoder 203 communicate is coupled to a data buffer section 200 and the beam forming network 204 (FIG. 3), digital summer 114, modulator (i.e., comparators 120a, 120b, and bridge amplifier 13 via a bus 105. The data/control bus 205, along with the output of the bridge amplifier 13, is coupled to an aperture switching network 38 and projectors 36, as indicated.

The data buffer section 200 includes a plurality of digital memories 202, 204, 206, 208 and 210. Memory 202 stores the digital samples of the waveform to be transmitted, where such waveform is known a priori and such samples are stored in the waveform generator sections 104', FIG. 3, and fed to the beam forming network 104. Memory 204 stores course time delay coefficients for the FIR filters 102', FIG. 3, used in the beam forming network 104. Memory 206 stores interpolation and fine time delay data used by the FIR filters 102' in the beam forming network 102. Memory 208 includes modulation parameters (e.g., slope, etc.) of the modulation waveform produced by generator 112 (FIG. 3). Feedback coefficients for the IIR filters 118a, 118b (FIG. 3) are stored in memory 210.

Figure 1:
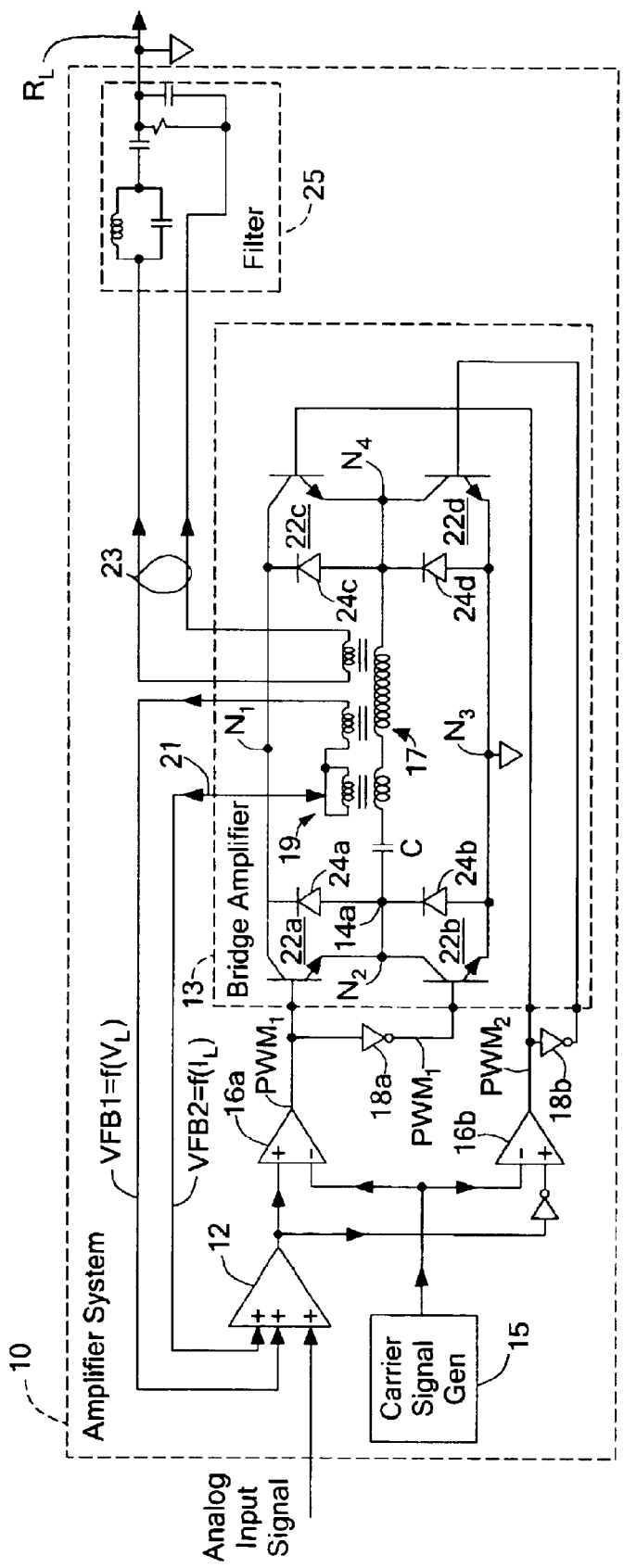
FIG. 1 is a schematic diagram of a switching amplifier according to the PRIOR ART.
Figure 2:
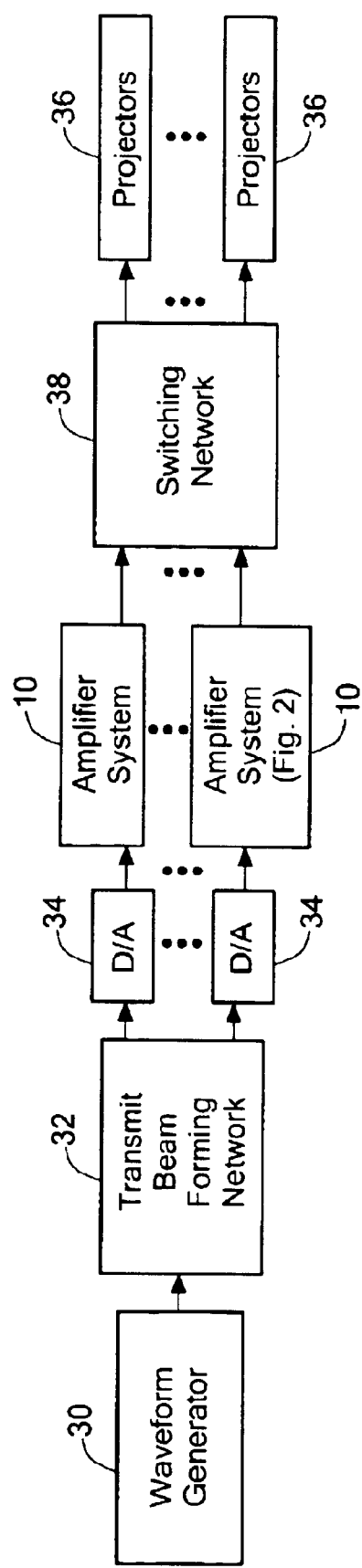
FIG. 2 is a block diagram of a wave energy transmitting system using the switching amplifier of FIG. 1 according to the PRIOR ART.

Thus, referring to both FIGS. 3 and 4, the outputs of the beam forming network 104 are combined in summer 114 with the outputs of the feedback processing (i.e., IIRs 118a, 118b) to produce the composite signal. The composite digital signal is modulated with the carrier signal produced by the carrier signal generator 112 to produce switching signals $Q_A$, $Q_B$ are their compliments $Q_A'$, $Q_B'$, respectively, for the bridge amplifier 13 (FIG. 1).

Thus, the interface 201 sends status and performance monitoring/fault localization information to system control elements (i.e., other systems, not shown) via bus 205. The message decode/encoder provides the interface between the host/waveform generator (i.e., the first-mentioned pair of "other systems" and the transmit subsystem (i.e., the aperture switching network 38, that is the second-mentioned one of the "other systems". It decodes received messages and stores the various data and processing parameters in the data buffer section 200. It then relays necessary data and control information to the other elements of the transmit subsystem. It reads status and performance monitoring data from these elements and encodes them for transmission to the external control system function. The function provides for system timing and synchronization.

As discussed above, the signal to be amplified and transmitted is received as a digital stream of data. The digital stream of data is received by the message encode/decoder 202. As noted above, signal may be either a continuous signal or a pulse. The pulse can/will be used repetitively as in a train of sonar pulses. Alternatively, the if it is desired to use a limited set of pulse signals, then those signals could be stored in advance in a read-only-memory (ROM) as part of the fabrication process.

The transmit beam forming function is comprised, as noted above, of a course function and an interpolation and finite delay function. The course delay function applies to each transmit channel $103_1$–$103_M$ (FIG. 3), a separate delay in time increments of the supplied waveform sampling rate. The delays are defined for each channel $103_1$–$103_M$ (FIG. 3) being generated, by the beam steering computer, not shown. The interpolation and fine delay function increases the data-samples rate in order to obtain a finer transmit time delay for each channel $103_1$–$103_M$ (FIG. 3) and to obtain a sampling rate compatible with the modulation process. It does this by computing a digital filter, here with FIR 102, for each transmit channel $103_1$–$103_M$ (FIG. 3). The FIR filter 102 is computed at a rate equal to N times the input sampling rate, where N is an integer in the order of 10, utilizing a set of FIR filter coefficients for each pass and each channel. This interpolation ratio, e.g., the integer 10, is programmable. The size of the FIR filter 103, i.e., the number of coefficients used therein, and the interpolation ratio, N. can be adjusted for different system requirements.

For each channel $103_1$–$103_M$ (FIG. 3), the output analog current and voltage are sampled, analog-to-digital converted using A/Ds 116a, 116b, respectively, and digitally filtered using IIR filters 118a, 118b, respectively. This digitally filtered feedback data is combined with the digitally FIR filtered samples of the transmit waveform in digital summer 114 at a rate equal to the interpolated waveform sampling rate. The results are supplied to the comparators 120a, 120b as described above to perform the modulation function and the thereby generate the switching signals, $Q_A$, $Q_A'$, $Q_B$, $Q_B'$ for the amplifier bridge 10. Separate IIR filter coefficients are used in each of the IIR filters 118am 118b. The number of feedback channels can be increased or decreased to accommodate a 3-state, 5-state, 7-state, 9-state, or n-state modulation, where n is an integer. The IIR filter size can be adjusted to accommodate different system requirements.

The carrier signal generator 112 digitally computes the several modulation waveforms, (e.g., sawtooth, triangular, etc.) These waveforms are programmable in initial phase and frequency thereby permitting the separate transmit channels $103_1$–$103_M$ (FIG. 3) to use non-synchronous carrier signals. Alternative modulation schemes are supported by the programmable nature of the carrier signal generator 112. The modulation signal generator (i.e., comparators 120a, 120b) generates (i.e., digitally computes) a set of pulse width modulation signals, $Q_A$, $Q_B$, and their compliments $Q_A'$, $Q_B'$, respectively, by comparing the interpolated waveform to the carrier signal produced by the carrier signal generator 112. The resulting binary signals. $Q_A$, $Q_A'$, $Q_B$. $Q_B'$ are further processed in accordance with output circuit topology and component characteristics to the bridge amplifier 10 to control the operation of the high voltage switching elements (i.e., transistors 22a, 22b, 22c, and 22d along with diodes 24a, 24b, 24c, 24d) as described in the above-referenced U.S. Pat. No. 4,092,610. This further processing use a set of logic functions primarily used for guaranteeing the actual transistor on-off characteristics so that the bridge is never placed in an undesireable state (e.g., having two transistors on in such a way as to connect the high voltage power directly to ground).

A number of embodiments of the invention have been described. Never the less, it will be understood that various modifications may be made without departing from the spirit and scope of the invention. Accordingly, other embodiments are within the scope of the following claims.

What is claimed is:

1. An amplification system, comprising:

a bridge amplifier comprising a plurality of amplifying elements arranged in legs of a bridge circuit, a first pair of nodes of the bridge circuit being coupled across a voltage supply and second pair of nodes of the bridge circuit being coupled to a load, such amplifying elements being fed by a plurality of switching signals, such bridge amplifier producing a feedback signal;

an analog to digital converter section fed by the feedback signal for converting such feedback signal into a corresponding digital feedback signal;

a digital summer section fed by digital samples of a signal to be amplified by the amplification system and by the digital feedback signal for producing a composite digital signal for producing the plurality of switching signals for the bridge amplifier amplifying elements.

2. The amplification system recited in claim 1 wherein the digital summer section comprises:

a carrier signal source for producing digital signals representative of a carrier frequency signal; and a modulator section fed by the digital signals produced by the carrier signal source and the composite digital signal for producing the plurality of switching signals for the bridge amplifier amplifying elements.

3. The amplification system recited in claim 2 wherein the modulator section comprises:

a comparator section fed by the composite digital signal and the carrier signal source produced signal, such comparator section producing the plurality of switching signals.

4. An amplification system, comprising:

a bridge amplifier comprising a plurality of amplifying elements arranged in legs of a bridge circuit, a first pair of nodes of the bridge circuit being coupled across a voltage supply and second pair of nodes of the bridge circuit being coupled to a load, such amplifying elements being fed by a plurality of switching signals, such bridge amplifier producing a feedback signal representative of current passing through the bridge circuit and a voltage produced by the bridge across the second pair of nodes;

an analog to digital converter section fed by the feedback signal for converting such feedback signal into a corresponding digital feedback signal;

a digital summer fed by digital samples of a signal to be amplified by the amplification system and by the digital feedback signal for producing a composite digital signal;

a modulator section fed by the composite digital signal and the carrier signal source produced signal for producing the plurality of switching signals for the bridge amplifier amplifying elements.

5. The amplification system recited in claim 4 wherein the modulator section comprises:

a carrier signal source for producing digital signals representative of a carrier frequency signal; and a comparator section fed by the composite digital signal and the carrier signal source produced signal for producing the plurality of switching signals for the bridge amplifier amplifying elements.

6. Apparatus for transmitting a collimated and directed beam of wave energy, comprising:

(A) a beam-forming network fed by a source of digital samples of the wave energy and having a plurality of output ports, such beam-forming network coupling the digital samples of the wave energy with distribution of time delays across the ports, such distribution of time delays being in accordance with direction of the transmitted beam of wave energy, such beam-forming network comprising:

a plurality of amplification sections, each one the sections comprising:

(a) a source of digital samples of the wave energy;

(b) a digital filter fed by digital samples for providing a time delay to the samples;

(c) an amplification system, such amplification system comprising:

(i) a bridge amplifier comprising a plurality of amplifying elements arranged in legs of a bridge circuit, a first pair of nodes of the bridge circuit being coupled across a voltage supply and second pair of nodes of the bridge circuit being coupled to a load, such amplifying elements being fed by a plurality of switching signals, such bridge amplifier producing a feedback signal representative of current passing through the bridge circuit and a voltage produced by the bridge across the second pair of nodes;

(ii) an analog to digital converter section fed by the feedback signal for converting such feedback signal into a corresponding digital feedback signal;

(iii) a digital summer fed by digital samples of a signal to be amplified by the amplification system and by the digital feedback signal for producing a composite digital signal; and (iv) a modulator section fed by the composite digital signal and the carrier signal source produced signal for producing the plurality of switching signals for the bridge amplifier amplifying elements;

(B) an array of transmitting elements coupled to the plurality of amplification sections.

7. The apparatus recited in claim 6 wherein the modulator section comprises:

a carrier signal source for producing digital signals representative of a carrier frequency signal; and a comparator section fed by the composite digital signal and the carrier signal source produced signal for producing the plurality of switching signals for the bridge amplifier amplifying elements.

* * * * *

UNITED STATES PATENT AND TRADEMARK OFFICE
CERTIFICATE OF CORRECTION

PATENT NO. : 6,809,586 B1
DATED : October 26, 2004
INVENTOR(S) : Namir W. Habboosh et al.

It is certified that error appears in the above-identified patent and that said Letters Patent is hereby corrected as shown below:

Title page,
Item [12], delete "Hobboosh et al" and replace with -- Habboosh et al. --.
Item [75], Inventors, delete "Namir W. Hobboosh"and replace with -- Namir W. Habboosh --.

Column 1,
Line 21, delete "1064" and replace with -- 1964, --.
Line 24, delete "were" and replace with -- was --.
Lines 30-31, delete "Benjermin" and replace with -- Benjamin --.
Line 44, delete "of sawtooth" and replace with -- or sawtooth --.
Line 55, delete "arc" and replace with -- are --.

Column 2,
Line 31, delete "coats" and replace with -- co-acts --.

Column 3,
Line 1, delete "systems"and replace with -- system --.
Line 35, delete "having-stored" and replace with -- having stored --.

Column 4,
Line 20, delete "(IF" and replace with -- (IIF --.
Line 21, delete "as shown." and replace with -- shown) --.
Line 42, delete "M." and replace with -- M, --.

Column 5,
Line 24, delete "bus 105." and replace with -- bus 105). --.
Line 48, delete "are their"and replace with -- and their --.
Line 57, delete ""other systems"." and replace with -- "other systems")) --.

Column 6,
Line 4, delete ",the if it" and replace with -- , if it --.
Line 26, delete "N." and replace with -- N --.
Line 37, delete "the thereby" and replace with -- thereby --.
Line 39, delete "118am" and replace with -- 118a --.
Line 62, delete "use" and replace with -- uses --.

UNITED STATES PATENT AND TRADEMARK OFFICE
CERTIFICATE OF CORRECTION

PATENT NO. : 6,809,586 B1
DATED : October 26, 2004
INVENTOR(S) : Namir W. Habboosh et al.

It is certified that error appears in the above-identified patent and that said Letters Patent is hereby corrected as shown below:

Column 7,
Line 2, delete "Never the less" and replace with -- Nevertheless --.

Column 8,
Line 17, delete "one the" and replace with -- one of the --.

Signed and Sealed this

Twenty-sixth Day of April, 2005

JON W. DUDAS
*Director of the United States Patent and Trademark Office*